(12) United States Patent
Yamazaki

(10) Patent No.: US 10,375,816 B2
(45) Date of Patent: Aug. 6, 2019

(54) PRINTED-CIRCUIT BOARD, PRINTED-WIRING BOARD, AND ELECTRONIC APPARATUS

(71) Applicant: CANON KABUSHIKI KAISHA, Tokyo (JP)

(72) Inventor: Keita Yamazaki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/558,940

(22) PCT Filed: Apr. 26, 2016

(86) PCT No.: PCT/JP2016/002202
§ 371 (c)(1),
(2) Date: Sep. 15, 2017

(87) PCT Pub. No.: WO2016/181628
PCT Pub. Date: Nov. 17, 2016

(65) Prior Publication Data
US 2018/0077789 A1    Mar. 15, 2018

(30) Foreign Application Priority Data
May 8, 2015    (JP) .................. 2015-095338

(51) Int. Cl.
*H05K 1/02*    (2006.01)
*H05K 1/11*    (2006.01)
*H05K 1/18*    (2006.01)

(52) U.S. Cl.
CPC .......... *H05K 1/0209* (2013.01); *H05K 1/0203* (2013.01); *H05K 1/0206* (2013.01);
(Continued)

(58) Field of Classification Search
CPC ....... H01L 2924/00; H01L 2924/00014; H01L 2224/48227; H01L 2224/73265; H01L 2224/32225; H01L 2224/48091; H01L 2924/00012; H01L 2924/181;
(Continued)

(56) References Cited

U.S. PATENT DOCUMENTS

2002/0185718 A1* 12/2002 Mikubo ............... H01L 23/433
                                                                                     257/678
2005/0184381 A1*  8/2005 Asahi ................ H01R 13/2414
                                                                                     257/693
(Continued)

FOREIGN PATENT DOCUMENTS

JP    61-190177    11/1986
JP    63-20471     2/1988
(Continued)

OTHER PUBLICATIONS

International Preliminary Report dated Nov. 23, 2017 during prosecution of related European application No. PCT/JP2016/002202.
(Continued)

*Primary Examiner* — Adam B Dravininkas
(74) *Attorney, Agent, or Firm* — Venable LLP

(57) ABSTRACT

A printed-wiring board has a land group with which a terminal group of a semiconductor package has been joined, a first conductor pattern arranged in a mounting area where the semiconductor package is mounted and joined with a heat radiation plate of the semiconductor package, a second conductor pattern, at least a part of which is arranged on the outside of the mounting area, and a third conductor pattern which connects the first and second conductor patterns. The land group includes a first land adjacent to the third conductor pattern and a second land which is not adjacent to the third conductor pattern, and the first land is formed in a shape different from that of the second land so as to be away from the third conductor pattern.

20 Claims, 11 Drawing Sheets

(52) U.S. Cl.
CPC .............. *H05K 1/111* (2013.01); *H05K 1/115* (2013.01); *H05K 1/181* (2013.01); *H05K 2201/094* (2013.01); *H05K 2201/09372* (2013.01); *H05K 2201/09381* (2013.01); *H05K 2201/10553* (2013.01); *H05K 2201/10727* (2013.01); *H05K 2201/10969* (2013.01); *Y02P 70/611* (2015.11)

(58) Field of Classification Search
CPC ....... H01L 2224/97; H01L 2924/15311; H01L 2224/16225; H01L 2224/73204; H01L 2224/05599; H01L 2224/48247; H01L 2924/00013; H01L 2924/0105; H01L 2924/12042; H01L 2924/01029; H01L 2224/45015; H01L 2924/0132; H01L 2924/14; H01L 2224/45099; H01L 2224/32145; H01L 2924/0665; H01L 2924/014; H01L 2924/01079; H01L 2924/01047; H01L 2924/1305; H01L 2924/01033; H01L 2924/30107; H01L 24/48
See application file for complete search history.

(56) References Cited

U.S. PATENT DOCUMENTS

| | | | | |
|---|---|---|---|---|
| 2007/0240900 | A1* | 10/2007 | Yokomaku | H05K 1/141 174/262 |
| 2009/0294945 | A1* | 12/2009 | Okada | H01L 21/561 257/686 |
| 2010/0301466 | A1* | 12/2010 | Taoka | H01L 21/563 257/686 |
| 2011/0042794 | A1 | 2/2011 | Hsieh | |
| 2013/0292165 | A1* | 11/2013 | Lin | H05K 1/0296 174/260 |
| 2014/0043783 | A1* | 2/2014 | Ohira | H05K 1/0207 361/767 |
| 2014/0138836 | A1* | 5/2014 | Nagasawa | H01L 23/3677 257/766 |
| 2014/0174795 | A1 | 6/2014 | Nakazawa | |

FOREIGN PATENT DOCUMENTS

| | | |
|---|---|---|
| JP | 63-33669 | 3/1988 |
| JP | 3-132091 | 6/1991 |
| JP | 6-252285 | 9/1994 |
| JP | 2006-173154 | 6/2006 |
| JP | 2007-207826 | 8/2007 |
| JP | 2010-267869 | 11/2010 |

OTHER PUBLICATIONS

Japanese Office Action dated Apr. 25, 2019 during prosecution of related Japanese application No. 2015-095338 (English-language machine translation included.).

* cited by examiner

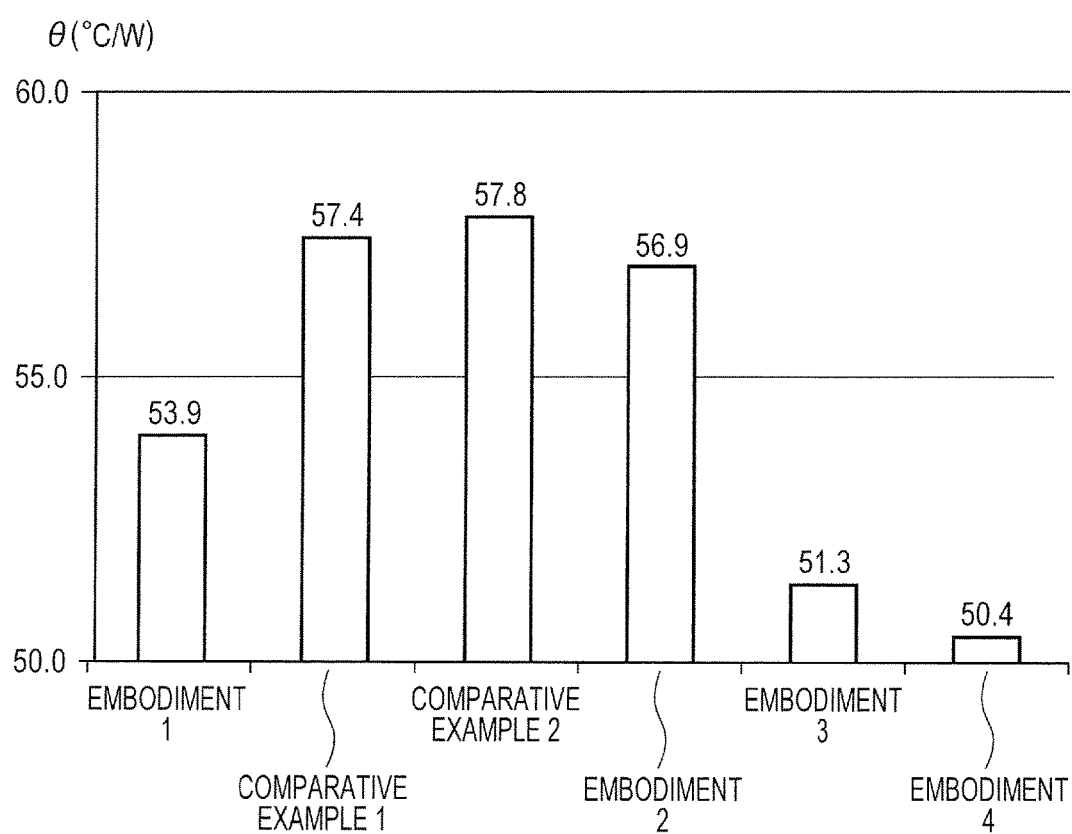

PRINTED-CIRCUIT BOARD, PRINTED-WIRING BOARD, AND ELECTRONIC APPARATUS

TECHNICAL FIELD

The invention relates to a printed-circuit board having a printed-wiring board on which an electronic component having a heat radiation part has been mounted and to a printed-wiring board on which an electronic component having a heat radiation part can be mounted.

BACKGROUND ART

In a printed-wiring board on which an electronic component has been mounted, such a heat problem that a temperature of the electronic component (semiconductor package such as an IC, LSI, or the like) rises occurs. This is because a driving ability of the electronic component has been enhanced. Therefore, an electronic component such as a semiconductor package (Heat_Quad_Flat_Non_lead_package: hereinbelow, referred to as HQFN) having terminal groups arranged on four sides of a bottom surface and a heat radiation plate serving as a heat radiation part for heat radiation arranged on the inside of the terminal groups, or the like has been produced.

The heat radiation plate of electronic component is joined with a land for heat radiation of the printed-wiring board by a conductive jointing material such as a solder or the like. Thus, a heat generated in the electronic component is radiated from the heat radiation plate to the land for heat radiation of the printed-wiring board through the jointing material. By a via conductor connected to the land for heat radiation, the heat is radiated to a layer on the side opposite to a layer on which the electronic component has been mounted or to a conductor pattern arranged in a layer existing at an intermediate position between the electronic component mounted layer and the layer on the opposite side.

However, an amount of processes per unit time of the electronic component increases and there is such a tendency that in association with an increase in power loss (electric power consumption) per unit time, the temperature of the electronic component also rises.

As a conventional technology for solving such a heat problem, such a technology that a fan-shaped projecting portion which projects from a land for a heat radiation plate toward the outside of an electronic component is formed and a heat generated in the electronic component is radiated from the projecting portion has been proposed (refer to Patent Literature 1).

CITATION LIST

[Patent Literature]
PTL 1: Japanese Patent Application Laid-Open No. 2010-267869

SUMMARY OF INVENTION

Technical Problem

However, in recent years, there is such a tendency that the electronic component is miniaturized, a distance between terminals of the electronic component is narrowed, and a distance between lands of a land group with which a terminal group is joined d is also narrowed. Therefore, if the projecting portion is formed as disclosed in Patent Literature 1, since it is necessary to lead out a conductor pattern through a gap between the lands, a width of conductor pattern which is lead out from the gap between the lands narrowed. Consequently, a thermal resistance of the conductor pattern which is lead out from the gap between the lands increases and a performance of heat radiation of the electronic component decreases.

A purpose of this invention is to improve the performance of heat radiation of an electronic component.

Solution to Problem

According to this invention, a printed-circuit board forms: an electronic component having a heat radiation part; and a printed-wiring board on which the electronic component is mounted, wherein a land group with which a terminal group of the electronic component is joined, a first conductor pattern arranged in a mounting area where the electronic component is mounted and joined with the heat radiation part of the electronic component, a second conductor pattern at least a part of which is arranged on the outside of the mounting area, and a third conductor pattern which connects the first conductor pattern to the second conductor pattern are formed on the printed-wiring board, the land group includes a first land adjacent to the third conductor pattern and a second land which is not adjacent to the third conductor pattern, and the first land is formed in a shape different from that of the second land so as to be spaced from the third conductor pattern.

According to this invention, a printed-wiring board on which an electronic component having a heat radiation part can be mounted, forms: a land group with which a terminal group of the electronic component is joined; a first conductor pattern which is arranged in a mounting area where the electronic component is mounted and which is joined with the heat radiation part of the electronic component; a second conductor pattern at least a part of which is arranged on the outside of the mounting area; and a third conductor pattern which connects the first conductor pattern and the second conductor pattern, wherein the land group includes a first land adjacent to the third conductor pattern and a second land which is not adjacent to the third conductor pattern, and the first land is formed in a shape different from that of the second land so as to be spaced from the third conductor pattern.

Further features of the present invention will become apparent from the following description of exemplary embodiments with reference to the attached drawings.

BRIEF DESCRIPTION OF DRAWINGS

FIG. 11 is a graph illustrating heat radiating effects of semiconductor packages according to the printed-wiring boards in Examples 1 to 4 and Comparative Examples 1 and 2.

DESCRIPTION OF EMBODIMENTS

Embodiments for embodying the invention will be described in detail hereinbelow with reference to the drawings.

First Embodiment

Figure 1A:
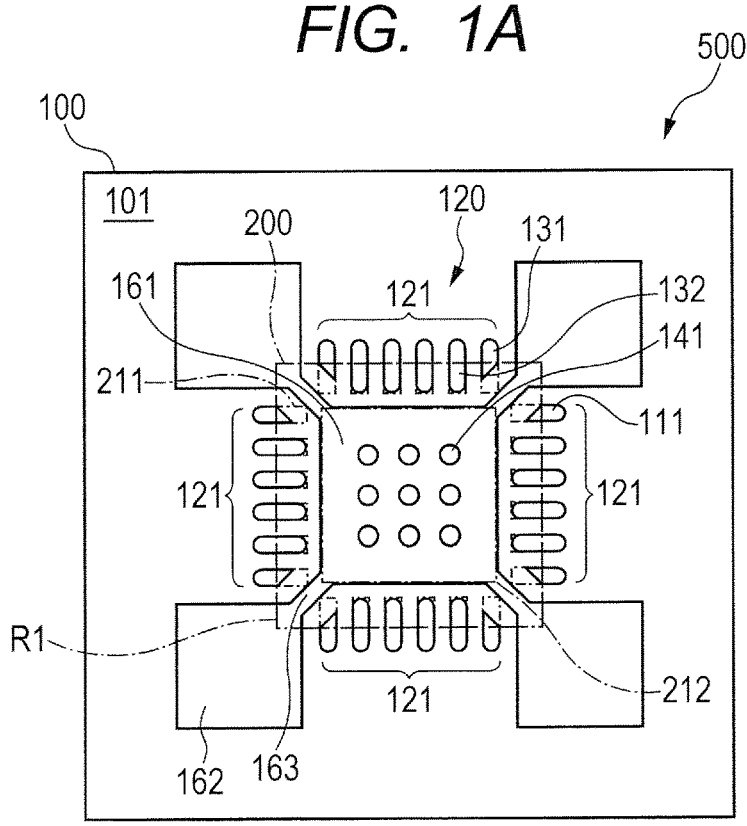
FIG. 1A is a top view illustrating a printed-wiring board according to the first embodiment of the invention.
Figure 1B:
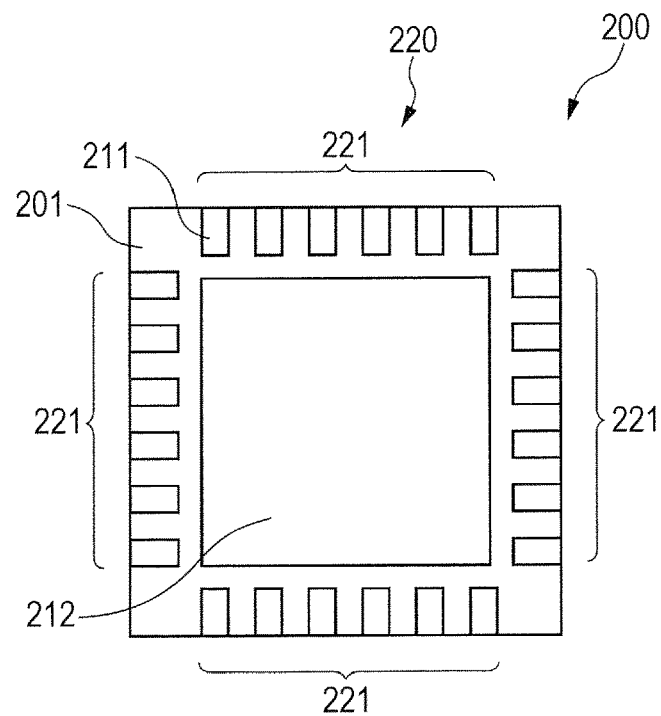
FIG. 1B is a bottom view illustrating an electronic component which is mounted onto the printed-wiring board according to the first embodiment of the invention.

FIG. 1A is a top view illustrating a printed-wiring board (there is no solder resist) according to the first embodiment of the invention. FIG. 1B is a bottom view illustrating an electronic component which is mounted onto the printed-wiring board according to the first embodiment of the invention. That is, FIG. 1A is a flat view illustrating a surface (mounting surface) on the side where the electronic component is mounted in the printed-wiring board. FIG. 1B is a flat view illustrating a surface on the side which faces the mounting surface of the printed-wiring board in the electronic component. In FIG. 1A, an illustration of a solder resist is omitted and the electronic component which is mounted onto the printed-wiring board and is illustrated in FIG. 1B is shown by an alternate long and short dash line.

The printed-wiring board mentioned here is such a board that the electronic component is not mounted and the printed-circuit board mentioned here is such a board that the electronic component has been mounted on the printed-wiring board. Although not shown, conductor patterns such as signal lines, power line, ground line, and the like have been formed on the printed-wiring board.

As illustrated in FIG. 1A, a printed-circuit board 500 has: a printed-wiring board 100; and a semiconductor package 200 as an electronic component. The semiconductor package 200 is mounted onto one (front surface 101) of a pair of front surfaces of the printed-wiring board 100. That is, the semiconductor package 200 can be mounted onto the printed-wiring board 100 and a state where the semiconductor package 200 is not mounted is illustrated in FIG. 1A. When the semiconductor package 200 is mounted onto the printed-wiring board 100 as shown by an alternate long and short dash line in FIG. 1A, the printed-circuit board 500 is constructed by the printed-wiring board 100 and the semiconductor package 200. Although not shown, another part may be mounted onto the printed-wiring board 100.

As illustrated in FIG. 1B, the semiconductor package 200 has a terminal group 220 forming a plurality of terminals 211 including: a signal terminal; a ground terminal; and a power terminal (dummy terminal according to circumstances). In the first embodiment, the semiconductor package 200 is an HQFN and has a heat radiation plate 212 serving as a heat radiation part. The heat radiation plate 212 also functions as one terminal among the ground terminal, power terminal, and signal terminal. In the first embodiment, the heat radiation plate 212 functions as a ground terminal.

The semiconductor package 200 is formed in an external rectangular parallelepiped shape, that is, an external quadrangular shape when it is seen from the direction perpendicular to the front surface 101 of the printed-wiring board 100 in a state where it has been mounted onto the printed-wiring board 100. On a surface 201 on the side which faces the printed-wiring board 100 in the semiconductor package 200, as illustrated in FIG. 1B, a plurality of terminals 211 are arranged on four sides of an external shape of the semiconductor package 200 so as to have intervals among them. That is, the terminal group 220 is constructed by four partial terminal groups 221 arranged on four sides of the semiconductor package (main body) 200. The heat radiation plate 212 is arranged in an area surrounded by the terminal group 220. The heat radiation plate 212 is formed in an external quadrangular shape when it is seen from the direction perpendicular to the bottom surface of the semiconductor package 200.

Figure 2:
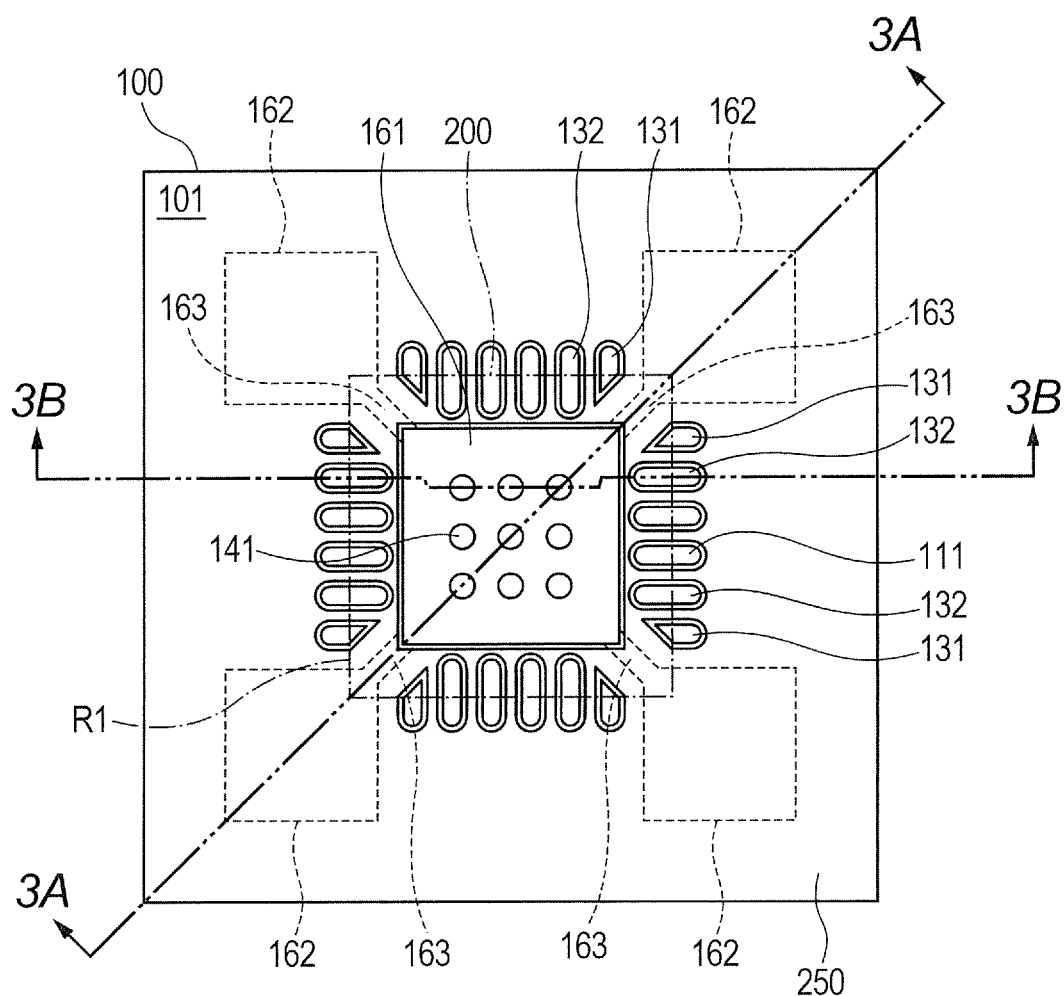
FIG. 2 is a top view illustrating the printed-wiring board according to the first embodiment of the invention.
Figure 3A:
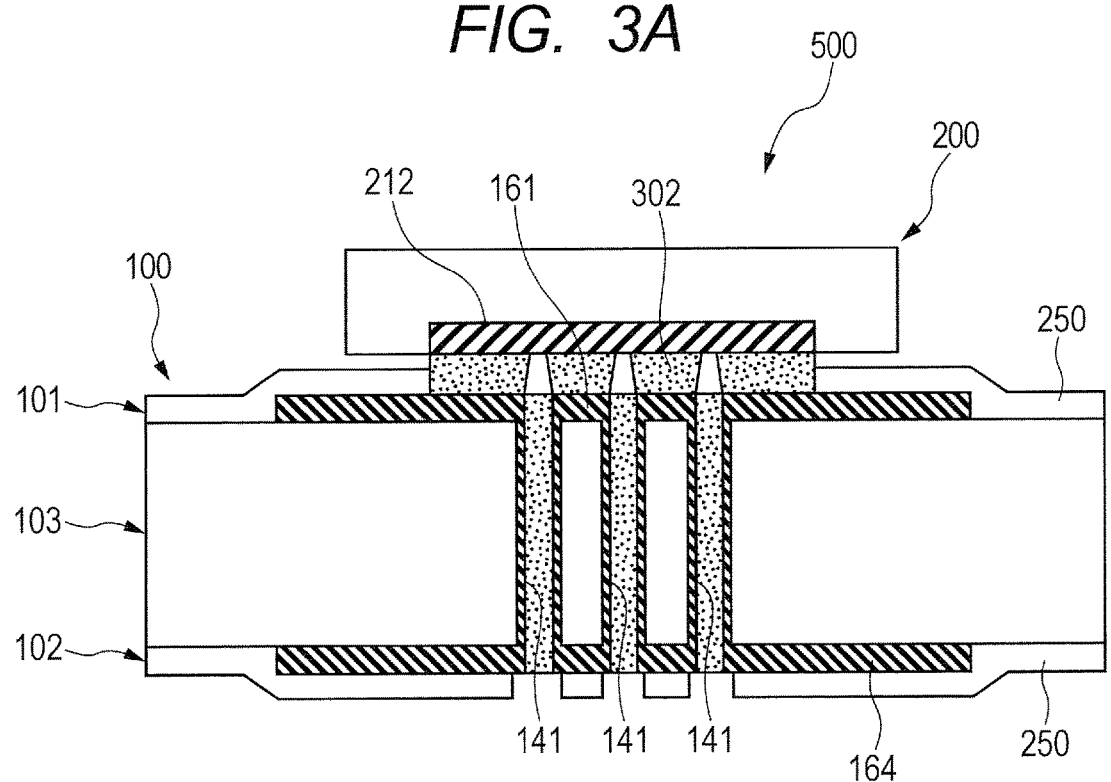
FIG. 3A is a cross sectional view illustrating a cross section of a printed-circuit board taken along the line 3A-3A in FIG. 2.
Figure 3B:
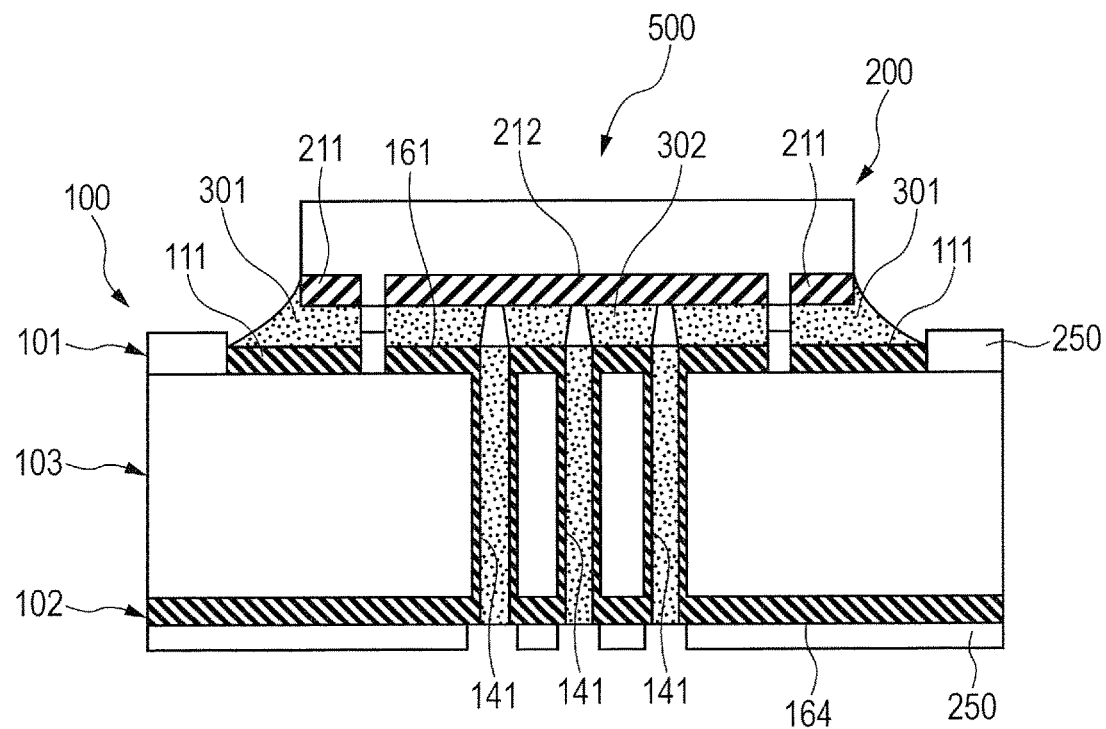
FIG. 3B is a cross sectional view illustrating a cross section of the printed-circuit board taken along the line 3B-3B in FIG. 2.

FIG. 2 is a top view illustrating the printed-wiring board (having a solder resist) according to the first embodiment of the invention. FIG. 2 is a plan view illustrating the surface (mounting surface) on the side where the semiconductor package 200 is mounted in the printed-wiring board 100. FIG. 3A is a cross sectional view illustrating a cross section of the printed-circuit board taken along the line 3A-3A in FIG. 2. FIG. 3B is a cross sectional view illustrating a cross section of the printed-circuit board taken along the line 3B-3B in FIG. 2. The printed-circuit board 500 in FIGS. 3A and 3B is constructed by mounting the semiconductor package 200 illustrated in FIG. 1B onto the printed-wiring board 100 illustrated in FIG. 2.

The printed-wiring board 100 is a printed-wiring board of two and over layers (two layers in the first embodiment) and is constructed by laminating a plurality of conductor layers 101 and 102 through an insulator layer (dielectric layer) 103 made of an insulating material (dielectric material) as illustrated in FIGS. 3A and 3B.

In the conductor layers 101 and 102 of the printed-wiring board 100, a pair of surfaces of the printed-wiring board 100 are front-face layers 101 and 102. In the first embodiment, the front-face layer (front surface) 101 is a mounting surface on which the semiconductor package 200 is mounted. In the printed-wiring board 100, the front surface 101 as a mounting surface and the back surface 102 on the side opposite to the front surface are relative surfaces. The front surface 101 is also called one front surface or the first front surface. The back surface 102 on the side opposite to the front surface 101 is also called the other front surface or the second front surface. One front surface 101 of the printed-wiring board 100 is also called a front-face layer (first front-face layer) and the other front surface 102 is also called a back-face layer (second front-face layer). In the first embodiment, a solder resist 250 which covers a conductor pattern and is made of an insulating material (dielectric material) is formed on each of the front-face layers 101 and 102 as illustrated in FIGS. 2, 3A, and 3B.

The conductor layers 101 and 102 are layers on which the conductor patterns have mainly been arranged. The insulator layer 103 is a layer on which the insulating material has mainly been arranged. It is sufficient that the insulating material constructing the insulator layer 103 has electric insulation performance and is, for example, a resin obtained by hardening an epoxy resin or the like. The conductors forming the conductor patterns arranged in the conductor layers 101 and 102 and the conductors forming the via conductor arranged between the conductor layers 101 and 102 are a metal having high conductivity and thermal conductivity, for example, a metal such as copper, gold, or the like.

As illustrated in FIG. 1A, a land group 120 forming a plurality of lands 111 of the same number as that of terminals 211 is formed in the conductor layer 101. A conductor pattern 161 as a first conductor pattern, a conductor pattern 162 as a second conductor pattern, and a conductor pattern 163 as a third conductor pattern are formed in the conductor layer 101. The land group 120 and the conductor patterns 161, 162, and 163 are formed in the same conductor layer 101. In the first embodiment, there is one conductor pattern 161, there are four conductor patterns 162, and there are four conductor patterns 163.

As illustrated in FIG. 3B, each terminal 211 of the terminal group 220 of the semiconductor package 200 is joined with each land 111 of the land group 120 by a solder 301 as a jointing material having a conductivity.

The land group 120 is arranged at a position where it faces the terminal group 220 existing in an outer peripheral portion of the bottom surface of the semiconductor package 200. That is, a plurality of lands 111 are arranged so as to have intervals among them along an outer periphery of a mounting area R1 in which the semiconductor package 200 is mounted. The mounting area R1 is an inside area at the time when an external shape of the semiconductor package 200 is perpendicularly projected onto the printed-wiring board 100 when the semiconductor package 200 has been mounted on the printed-wiring board 100. The land group 120 is formed by four partial land groups 121 arranged along four sides of the mounting area R1.

As for the terminal 211, the solder 301 leaks and extends onto the whole bottom surface and side surfaces of the terminal 211, and as for the land 111, the solder 301 leaks and extends onto the whole upper surface of the land 111, thereby making the terminal 211 and the land 111 electrically conductive.

The conductor pattern 161 is arranged in the mounting area R1 (inside of the land group 120) and is joined with the heat radiation plate 212 on the bottom surface of the semiconductor package which faces the conductor pattern 161 by a solder 302 as a jointing material having a conductivity. The conductor pattern 161 is formed in an external quadrangular shape when it is seen from the direction perpendicular to the front surface 101 of the printed-wiring board 100.

At least a part (in the first embodiment, a portion of the half or more: that is, most of it) of the conductor pattern 162 is arranged on the outside of the mounting area R1. Since the conductor pattern 161 and the conductor pattern 162 are physically connected by the conductor pattern 163, they are electrically and thermally connected. In the first embodiment, four conductor patterns 163 are formed so as to be radially extended from four corners of the conductor pattern 161.

In the first embodiment, a conductor pattern 164 as a fourth conductor pattern is formed in the conductor layer 102 different from the conductor layer 101. It is sufficient that the conductor pattern 164 is formed at a position corresponding to at least the conductor pattern 161. In the first embodiment, the conductor pattern 164 is formed in almost the whole surface of the conductor layer 102.

In the printed-wiring board 100, through-holes (vias) are formed at positions corresponding to the conductor patterns 161 and 164. A via conductor 141 is formed in the through-hole (via). Since the conductor pattern 161 and the conductor pattern 164 are physically connected by the via conductor 141, they are electrically and thermally connected. In the first embodiment, the conductor pattern 161 and the conductor pattern 164 are connected by nine via conductors 141.

In FIG. 2, the conductor pattern 161 and the land group 120 are not covered with the solder resist 250 in order to join with the semiconductor package 200. The conductor pattern 162 and the conductor pattern 163 are covered with the solder resist 250. Since the conductor pattern 163 is covered with the solder resist 250, it is not come into contact with a land 131 and the terminal group 220 of the semiconductor package 200 (is not bridged by a solder or the like). It is not always necessary that the conductor pattern 162 and the conductor pattern 163 are covered with the solder resist 250 so long as they are not come into contact with the terminal group 220 of the semiconductor package 200. The conductor pattern 161 may have a partial area covered with the solder resist 250.

The land group 120 includes the land 131 as a first land and a land 132 as a second land. The land 131 is a land which is adjacent to the conductor pattern 163 so as to have an interval. Another conductor pattern is not arranged between the land 131 and the conductor pattern 163. The land 132 is a land which is not adjacent to the conductor pattern 163. The land 131 is arranged between the land 132 and the conductor pattern 163.

The land 131 is formed in a shape different from that of the land 132 so as to be away from the conductor pattern 163. Specifically speaking, the shape of the land 131 on the conductor pattern 163 side differs from the shape on the conductor pattern 163 side of the land 132.

In the conductor pattern 163, it is assumed that the direction which perpendicularly crosses the direction extending from the conductor pattern 161 toward the conductor pattern 162 is the width direction.

According to the first embodiment, by widening a width (in the width direction) of the conductor pattern 163 as much as possible, the land 131 adjacent to the conductor pattern 163 is formed in a shape different from the land 132 so that a predetermined distance or more is assured as a distance between the land 131 and the conductor pattern 163. By widening the width of the conductor pattern 163, a thermal resistance of the conductor pattern 163 decreases and the heat conducted to the conductor pattern 161 is easily conducted to the conductor pattern 162 through the conductor pattern 163. Therefore, the performance of heat radiation of the semiconductor package 200 which is mounted on the printed-wiring board 100 is improved. That is, a heat radiation amount from the mounting surface 101 from the mounting surface 101 in the printed-wiring board 100 can be increased.

The thermal resistance of the conductor pattern 163 is obtained by the following equation. It is now assumed that a thermal resistance is equal to θ, a thermal conductivity is equal to K, a length of the conductor pattern 163 is equal to L, a width is equal to W, and a thickness is equal to t.

$$\theta = L/(K \times t \times W)$$

From the above equation, by widening the width W of the conductor pattern 163, the thermal resistance of the conductor pattern 163 can be reduced. That is, by widening the width W, the performance of heat radiation of the semiconductor package 200 mounted on the printed-wiring board 100 can be raised. In other words, the heat radiation amount from the mounting surface 101 in the printed-wiring board 100 can be increased.

Figure 4:
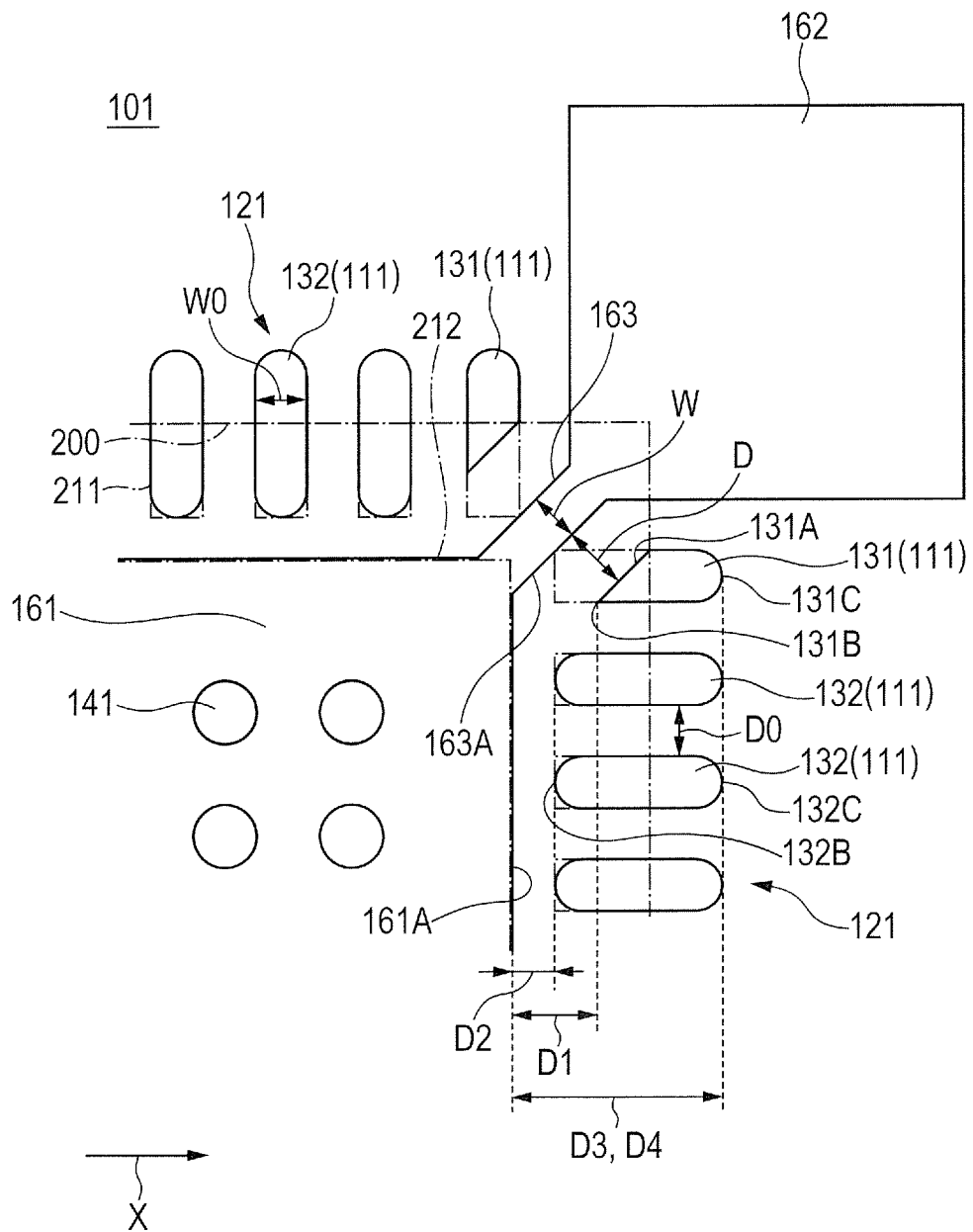
FIG. 4 is an enlarged top view illustrating a principal portion of the printed-wiring board according to the first embodiment of the invention.

FIG. 4 is an enlarged top view illustrating a principal portion of the printed-wiring board according to the first embodiment of the invention. As illustrated in FIG. 4, it is assumed that the width of the conductor pattern 163 is equal to W and a width of the land 132 is equal to W0. It is assumed that a clearance distance between the land 131 and the conductor pattern 163 is equal to D and a clearance distance between the two adjacent lands 132 and 132 is equal to D0.

The land 131 has one side 131A which faces one side 163A of the conductor pattern 163 so as to be away from each other. In the first embodiment, the side 163A of the conductor pattern 163 and the side 131A of the land 131 which face each other are away from each other by a predetermined distance or more. The predetermined distance is such a distance that an electrical insulation between the conductor pattern 163 and the land 131 is assured.

That is, the side 163A and the side 131A face each other and are away from each other in such a manner that the shortest distance among the distances between the side 163A and the side 131A is equal to the predetermined distance or more. In the first embodiment, the side 163A of the conductor pattern 163 and the side 131A of the land 131 which face each other are parallel. It is, therefore, sufficient that the clearance distance D between the sides 163A and 131A is equal to the predetermined distance or more.

Numerical values of the width W and the clearance distance D are determined in dependence on a substrate manufacturing precision or the like. For example, upon substrate manufacturing, if a value of 0.075 mm and over is guaranteed as a minimum pattern width and a minimum clearance distance in which the substrate can be manufactured, it is desirable that each of the width W and the clearance distance D is equal to 0.075 mm and over. In this case, if the width W is equal to 0.075 mm and over, the heat generated in the semiconductor package 200 can be effectively conducted from the conductor pattern 161 to the conductor pattern 162 through the conductor pattern 163. If the clearance distance D is equal to 0.075 mm and over, the electrical insulation between the conductor pattern 163 and the land 131 can be assured. It is not always necessary to decide the numerical values of the width W and the clearance distance D only by the substrate manufacturing precision but they may be determined in accordance with an electric potential difference between the first land 131 and the conductor pattern 161.

The width W0 is decided in accordance with a width or the like of the terminal existing in an outer peripheral portion of the bottom surface of the semiconductor package. The clearance distance D0 is decided in accordance with a distance between the adjacent terminals and the substrate manufacturing precision or the like.

The conductor pattern 163 is formed so as to pass through a gap between the two adjacent partial land groups 121 and 121 among the four partial land groups 121. The land 131 is a land 111 locating in an end portion on the side adjacent to the conductor pattern 163 included in at least one (in the first embodiment, both) of the two adjacent partial land groups 121 and 121. That is, the land 131 is arranged in correspondence to the terminal 211 locating in (closest to) a corner portion of the semiconductor package 200 in the land group 120.

That is, an interval between the two adjacent partial land groups 121 and 121 (interval between the lands 131 and 131) is wider than an interval between the two adjacent lands 111 and 111 in the same partial land group 121. Therefore, the width of the conductor pattern 163 can be further widened.

In the first embodiment, the land 132 is formed so as to be long in the direction (for example, direction shown by an arrow X) which is away from the conductor pattern 161. An edge 131B on the side of the conductor pattern 161 of the land 131 is located in a distant place to the conductor pattern 161 than an edge 132B on the side of the conductor pattern 161 of the land 132 included in the partial land group 121 in which the land 131 is included. That is, a distance D1 between a side 161A of the conductor pattern 161 and the edge 131B of the land 131 which faces the side 161A is longer than a distance D2 between the side 161A of the conductor pattern 161 and the edge 132B of the land 132 which faces the side 161A. Therefore, the width of the conductor pattern 163 led out from a gap between the two adjacent partial land groups 121 and 121 can be widened.

A distance D3 between the side 161A of the conductor pattern 161 and an edge 131C on the side opposite to the edge 131B of the land 131 and a distance D4 between the side 161A of the conductor pattern 161 and an edge 132C on the side opposite to the edge 132B of the land 132 are equal.

In the first embodiment, the land 131 is formed in such a shape that the land 132 is cut away in parallel with the side 163A of the conductor pattern 163. Therefore, a length in the longitudinal direction of the land 131 is longer than a length in the longitudinal direction of the land 132. Thus, an area of the land 131 is smaller than an area of the land 132. In this manner, by forming the land 131 in such a shape that the land 132 has been cut away, a wiring area of a signal line or the like can be assured without enlarging a size of the land 131.

By forming the land 131 in such a shape that the land 132 has been cut away, a jointing intensity by the solder 301 between the land 131 and the terminal 211 decreases. However, a jointing intensity as a whole package is held owing to the joint by the solder 301 between another land 132 and the terminal 211 and the joint by the solder 302 between the conductor pattern 161 and the heat radiation plate 212. The electrical connection between the land 131 and the terminal 211 is also assured.

As illustrated in FIGS. 3A and 3B, the conductor pattern 161 and the conductor pattern 164 are connected by the via conductor 141. By the via conductor 141, the heat conducted to the conductor pattern 161 is conducted to the conductor pattern 164 through the via conductor 141. Therefore, since the heat is radiated from both of the front and back faces of the printed-wiring board 100, a performance of heat radiation of the semiconductor package 200 mounted on the printed-wiring board 100 is further improved.

As the number of via conductors 141 (that is, vias) is increased, as illustrated in FIGS. 3A and 3B, an amount of solder which is inhaled into a plurality of via-holes increases and a jointing area between the heat radiation plate 212 and the conductor pattern 161 decreases.

In the first embodiment, even if a number of via conductors 141 are not arranged in the conductor pattern 161, by widening the width of the conductor pattern 163, the performance of heat radiation of the semiconductor package 200 by the printed-wiring board 100 can be assured. Therefore, the number of via conductors 141 can be reduced and an amount of solder 302 which flows out onto the surface 102 on the side opposite to the mounting surface 101 on which the semiconductor package 200 has been mounted can be reduced. Thus, such a situation that a jointing area between the heat radiation plate 212 of the semiconductor package 200 and the conductor pattern 161 is reduced by the flow-out of the solder can be avoided. A defective such as a void or the like which occurs due to a flux-gas as a factor can be also decreased.

As described above, according to the first embodiment, the occurrence of a defective solder joint between the small semiconductor package 200 and the printed-wiring board 100 can be avoided. The performance of heat radiation of the semiconductor package 200 by the printed-wiring board 100 can be improved.

In addition, since the lands 131 are arranged in the end portions of the partial land group 121, the conductor pattern 163 is arranged so as to face corner portions (in the first embodiment, all of four corners) of an outer shape of the semiconductor package 200. Therefore, in electronic components of the same size in which layouts of signal terminals differ, the same foot print can be used in common and a designing time can be shortened.

Further, in the land group 120 arranged at a position which faces the terminal group 220 existing in the outer peripheral portion of the bottom surface of the semiconductor package 200, the land 131 is arranged in the end portion of the partial land group 121. By arranging the lands 131 only in the end portions of the partial land group 121, such a situation that a self-alignment action at the time of reflowing deteriorates is avoided, and an angular deviation of the mounting position of the semiconductor package 200 can be reduced.

Further, even if there is not such a signal terminal restriction that a terminal (ground terminal) of the same electric potential as that of the heat radiation plate 212 is arranged near the corner portion of the semiconductor package 200 or the like, the thermal resistance of the conductor pattern 163 can be reduced.

In addition, the conductor pattern 163 is extended from the corner portion of the conductor pattern 161 and is formed so as to be inclined to the side 161A of the conductor pattern 161. The land 131 has one side 131A which is inclined to the side 161A. Further, the length in the longitudinal direction of the land 131 is set to be shorter than the length in the longitudinal direction of the land 132. Thus, the width of the conductor pattern 163 can be widened and the thermal resistance of the conductor pattern 163 can be reduced. Further, by setting the side 131A of the land 131 to be parallel with the side 163A of the conductor pattern 163, the width of the conductor pattern 163 can be further widened and the thermal resistance can be further reduced.

It is sufficient that the position of the edge 131B of the land 131 is set in such a manner that the terminal 211 and the land 131 can be joined by a solder and, within a joint possible range of them, such a position is far from the position of the edge 132B of the land 132 to the conductor pattern 161.

Figure 5A:
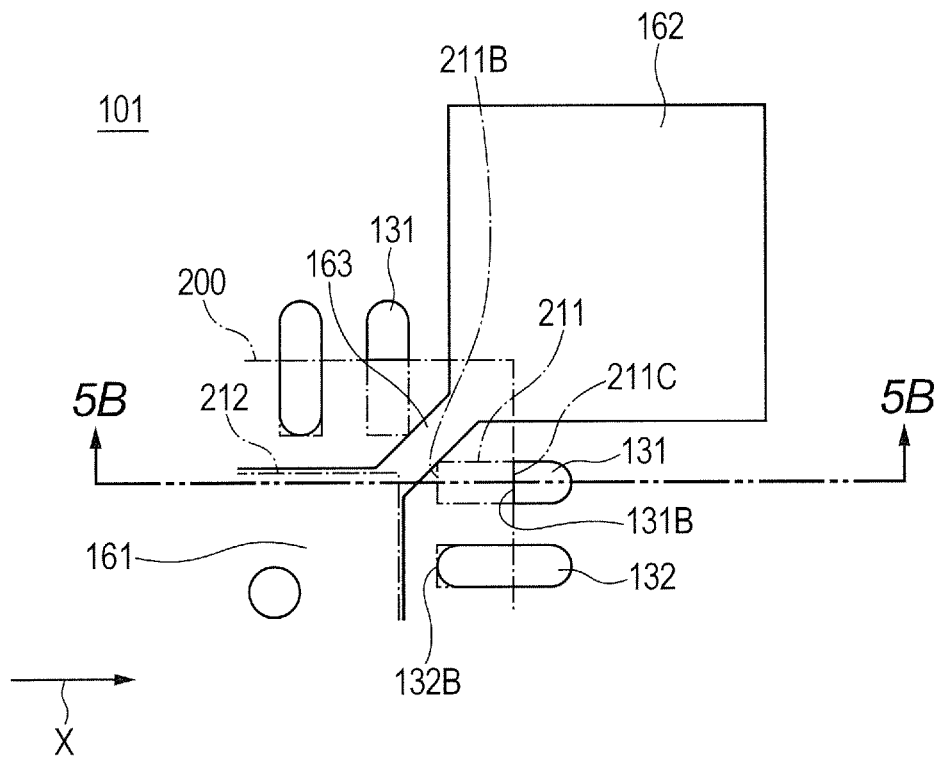
FIG. 5A is an enlarged top view illustrating a modification of the printed-wiring board according to the first embodiment of the invention.
Figure 5B:
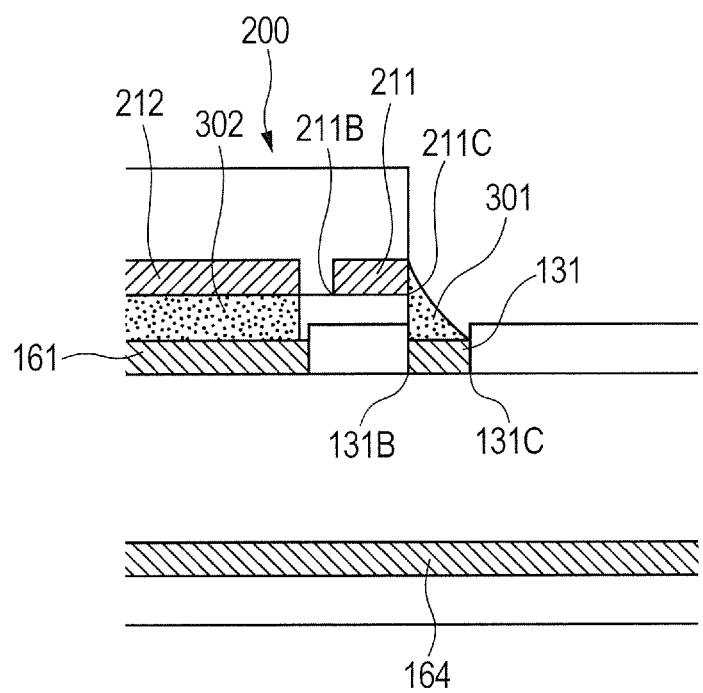
FIG. 5B is a cross sectional view of a printed-circuit board taken along the line 5B-5B in FIG. 5A.

FIG. 5A is an enlarged top view illustrating a modification of the printed-wiring board according to the first embodiment of the invention. FIG. 5B is a cross sectional view illustrating a printed-circuit board taken along the line 5B-5B in FIG. 5A. FIGS. 5A and 5B illustrate a case where the edge 131B is arranged at a most distant position to the conductor pattern 161.

As illustrated in FIG. 5A, the land 131 may be formed in such a manner that when seen from the direction perpendicular to the mounting surface 101 of the printed-wiring board 100, the edge 131B of the land 131 overlaps with an edge 211C on the side opposite to an edge 211B on the side of the heat radiation plate 212 in the terminal 211. In this case, as illustrated in FIG. 5B, it is sufficient that when the terminal 211 and the land 131 are joined by the solder 301, the side surface (edge surface, that is, the edge 211C) of the terminal 211 is in contact with the solder 301. In this case, although a contribution in the terminal 211 and the land 131 to the jointing intensity between the semiconductor package 200 and the printed-wiring board 100 is small, the electrical connection between the terminal 211 and the land 131 is assured.

Figure 6:
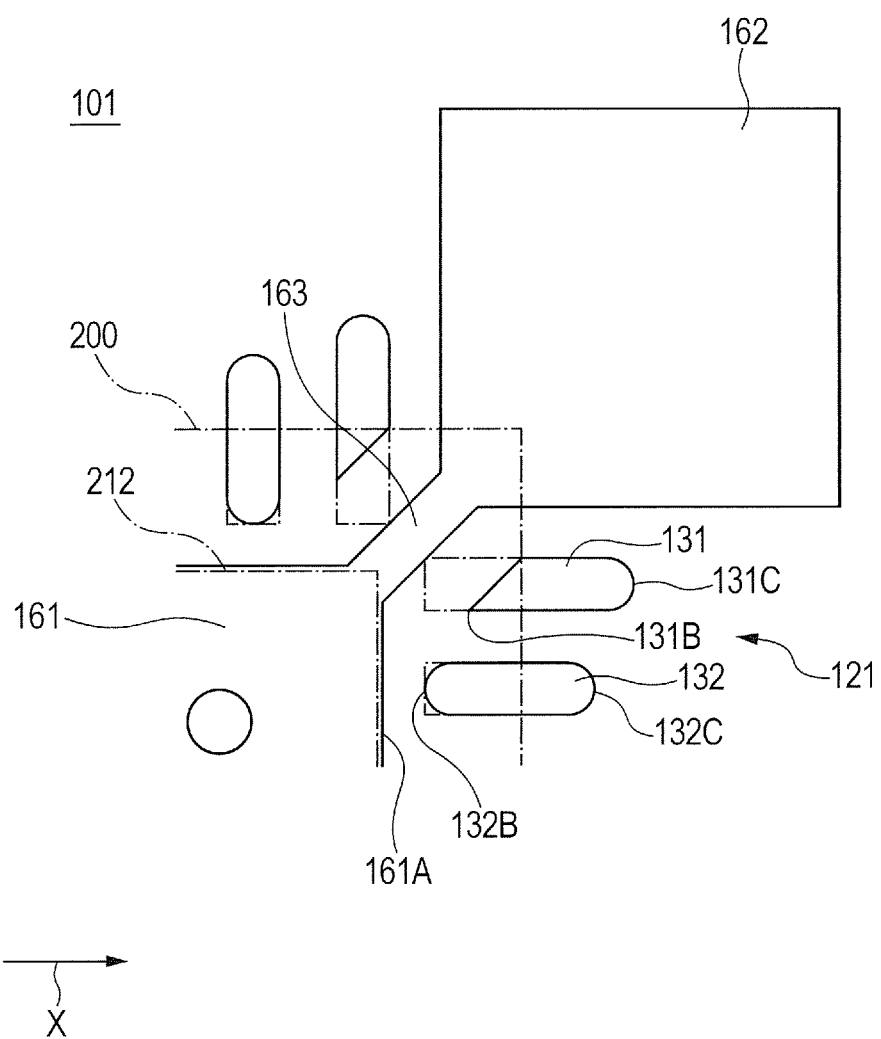
FIG. 6 is an enlarged top view illustrating another modification of the printed-wiring board according to the first embodiment of the invention.

Although the case where the distance D3 between the side 161A of the conductor pattern 161 and the edge 131C of the land 131 and the distance D4 between the side 161A of the conductor pattern 161 and the edge 132C of the land 132 coincide has been described above, the invention is not limited to such an example. FIG. 6 is an enlarged top view illustrating another modification of the printed-wiring board according to the first embodiment of the invention. Although the area of the land 131 is smaller than that of the land 132 in FIG. 4, as illustrated in FIG. 6, the area of the land 131 may be equal to or larger than that of the land 132.

In FIG. 6, the edge 131B of the land 131 exists in a distant place in the arrow X direction to the conductor pattern 161 than the edge 132B of the land 132 included in the partial land group 121 in which the land 131 is included. Even in such a case, the width of the conductor pattern 163 can be widened, the thermal resistance in the conductor pattern 163 is reduced, and the performance of heat radiation of the semiconductor package 200 is improved.

Second Embodiment

Figure 7:
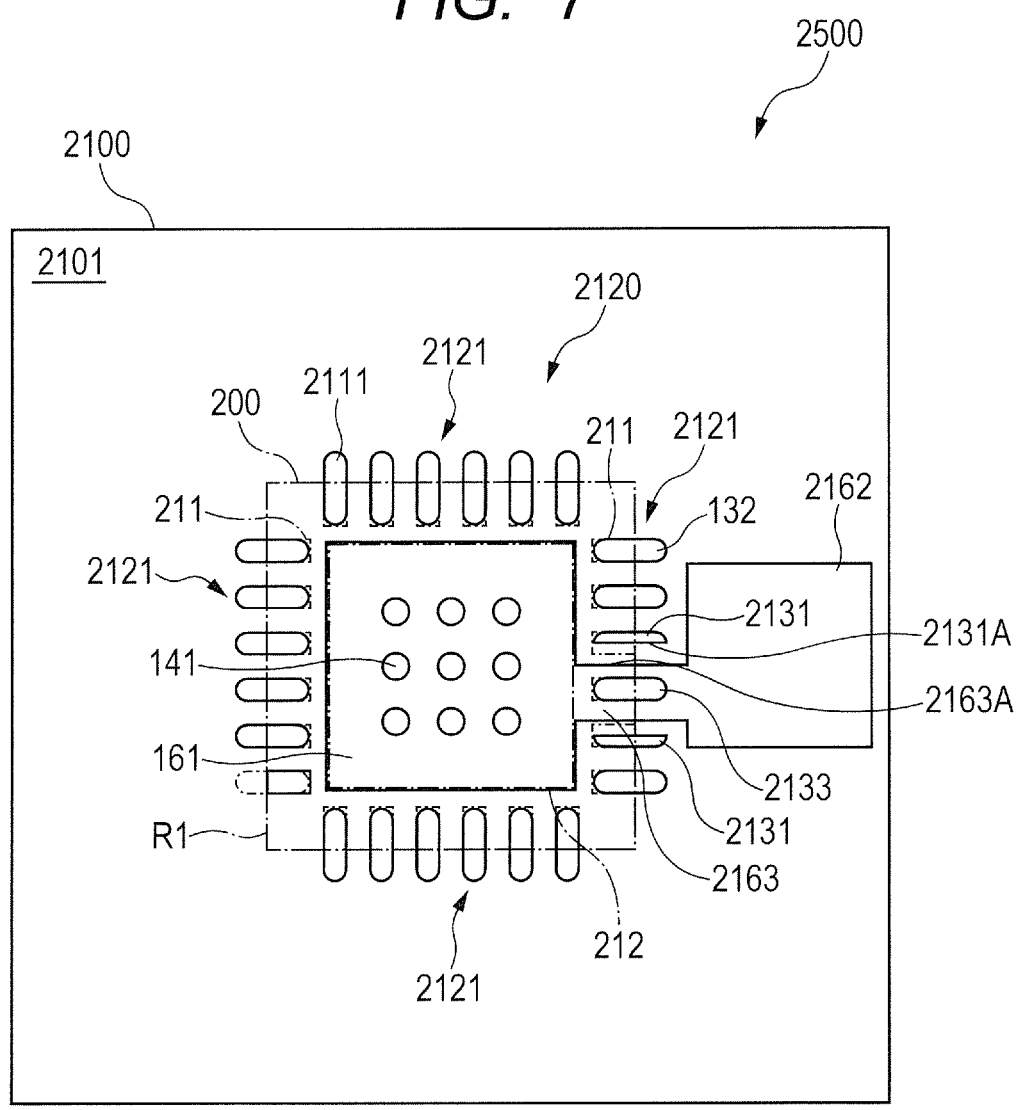
FIG. 7 is a top view illustrating a printed-wiring board according to the second embodiment of the invention.

A printed-circuit board (printed-wiring board) according to the second embodiment of the invention will be described. FIG. 7 is a top view illustrating the printed-wiring board according to the second embodiment of the invention. In the second embodiment, component elements similar to those in the first embodiment are designated by the same reference numerals and their description is omitted.

In the first embodiment, the case where the conductor pattern 163 as a third conductor pattern is formed between the lands (between the partial land groups 121 and 121) as illustrated in FIG. 1A has been described. In the third embodiment, a case where the third conductor pattern is connected to any one (third land) of the lands in the land group will be described.

As illustrated in FIG. 7, a printed-circuit board 2500 in the second embodiment has: a printed-wiring board 2100; and the semiconductor package 200 as an electronic component similar to that in the first embodiment.

A land group 2120 forming a plurality of lands 2111 of the same number as the number of terminals 211 of the semiconductor package 200 is formed in a conductor layer 2101 serving as a mounting surface on which the semiconductor package 200 is mounted. The conductor pattern 161 as a first conductor pattern, a conductor pattern 2162 as a second conductor pattern, and a conductor pattern 2163 as a third conductor pattern are formed in the conductor layer 2101. The land group 2120 and the conductor patterns 161, 2162, and 2163 are formed in the same conductor layer 2101. In the third embodiment, there are one conductor pattern 161, one conductor pattern 2162, and one conductor pattern 2163, respectively.

The conductor pattern 161 is arranged in the mounting area R1 (inside of the land group 2120) and is joined to the heat radiation plate 212 of the semiconductor package 200 which faces the conductor pattern 161 by a solder as a jointing material having a conductivity. The conductor pattern 161 is formed in an external quadrangular shape when it is seen from the direction perpendicular to the front surface 2101 of the printed-wiring board 2100.

At least a part (in the second embodiment, all) of the conductor pattern 2162 is arranged on the outside of the mounting area R1. Since the conductor pattern 161 and the conductor pattern 2162 are physically connected by the conductor pattern 2163, they are electrically and thermally connected. The conductor pattern 2163 is formed so as to be perpendicularly extended from the conductor pattern 161.

In the second embodiment, although not shown, a fourth conductor pattern is formed in a layer different from the conductor layer 101. In the printed-wiring board 2100, through-holes (vias) are formed at positions corresponding to the conductor pattern 161 and the fourth conductor pattern. The via conductor 141 is formed in the through-hole (via). Since the conductor pattern 161 and the fourth conductor pattern are physically connected by the via conductor 141, they are electrically and thermally connected. In the fourth embodiment, the conductor pattern 161 and the fourth conductor pattern are connected by nine via conductors 141.

The land group 2120 includes: a land 2131 as a first land adjacent to the conductor pattern 2163; and the land 132 as a second land which is not adjacent to the conductor pattern 2163. The land 2131 is formed in a shape different from that of the land 132 so as to be away from the conductor pattern 2163 by a predetermined distance or more. Specifically speaking, the land 2131 is formed in such a shape that the land 132 has been cut away. It is desirable that a width of the land 2131 is equal to about ½ of the width of the land 132.

According to the second embodiment, by widening the width (in the width direction) of the conductor pattern 2163 as much as possible, the land 2131 adjacent to the conductor pattern 2163 is formed in a shape different from that of the land 132 in order to assure a predetermined distance or more as a distance to the conductor pattern 2163. By widening the width of the conductor pattern 2163, the thermal resistance of the conductor pattern 2163 decreases and the heat conducted to the conductor pattern 161 is easily conducted to the conductor pattern 2162 through the conductor pattern 2163. Therefore, the performance of heat radiation of the semiconductor package 200 which is mounted on the printed-wiring board 2100 is improved.

The land 2131 has one side 2131A which faces one side 2163A of the conductor pattern 2163 so as to be away therefrom. In the second embodiment, the side 2131A of the land 2131 and the side 2163A of the conductor pattern 2163 which face each other are parallel. Therefore, the width of the conductor pattern 2163 can be further widened.

In the second embodiment, the land group 2120 includes a land 2133 as a third land connected to the conductor pattern 2163. In FIG. 7, the land 2133 is included in the conductor pattern 2163. Therefore, the width of the conductor pattern 2163 can be widened. Although the conductor pattern 2163 is covered with the solder resist 250 (refer to FIG. 2), the land 2133 is not covered with the solder resist. That is, a portion exposed in a non-covered portion of the solder resist is the land 2133 integrated with the conductor pattern 2163. Thus, the terminal 211 of the semiconductor package 200 and the land 2133 can be joined by the solder.

The land group 2120 forms four partial land groups 2121 arranged along the four sides of the mounting area R1. In the second embodiment, the land 2133 is a land locating in an intermediate portion between the lands locating in both end portions in at least one (partial land group 2121) of the four partial land groups 2121. In the printed-wiring board 2100 in the second embodiment, the land 2131 is arranged at a position other than the end portion of the partial land group 2121.

The heat radiation plate 212 of the semiconductor package 200 is joined with the conductor pattern 161 by a solder. That is, the land 2133 has the same electric potential as that of each of the conductor patterns 161, 2162, 2163, and the heat radiation plate 212. Therefore, a terminal of the semiconductor package 200 which is joined with the land 2133 is a terminal to which a voltage of the same electric potential as that of the heat radiation plate 212 is applied. Specifically speaking, when the heat radiation plate 212 functions as a ground terminal, a terminal which is joined with the land 2133 is a ground terminal.

Thus, a width of the conductor pattern 2163 can be further widened and a performance of heat radiation of the semiconductor package 200 mounted on the printed-wiring board 2100 can be further improved.

Since the land 2131 is a land arranged at a position other than the end portion in the partial land group 2121, such a situation that an intensity against a mechanical shock of the semiconductor package 200 decreases can be avoided.

Third Embodiment

Figure 8:
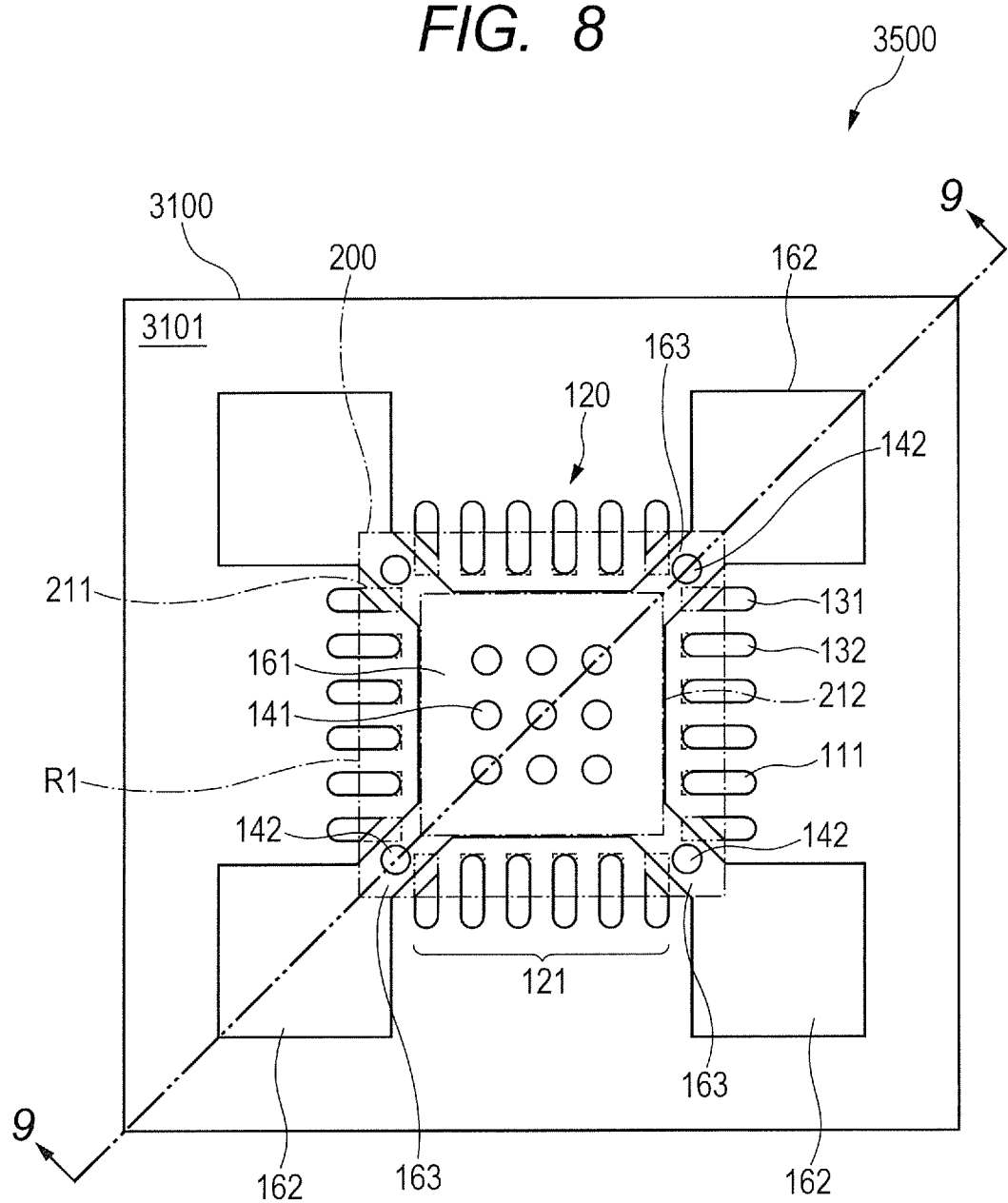
FIG. 8 is a top view illustrating a printed-wiring board according to the third embodiment of the invention.
Figure 9:
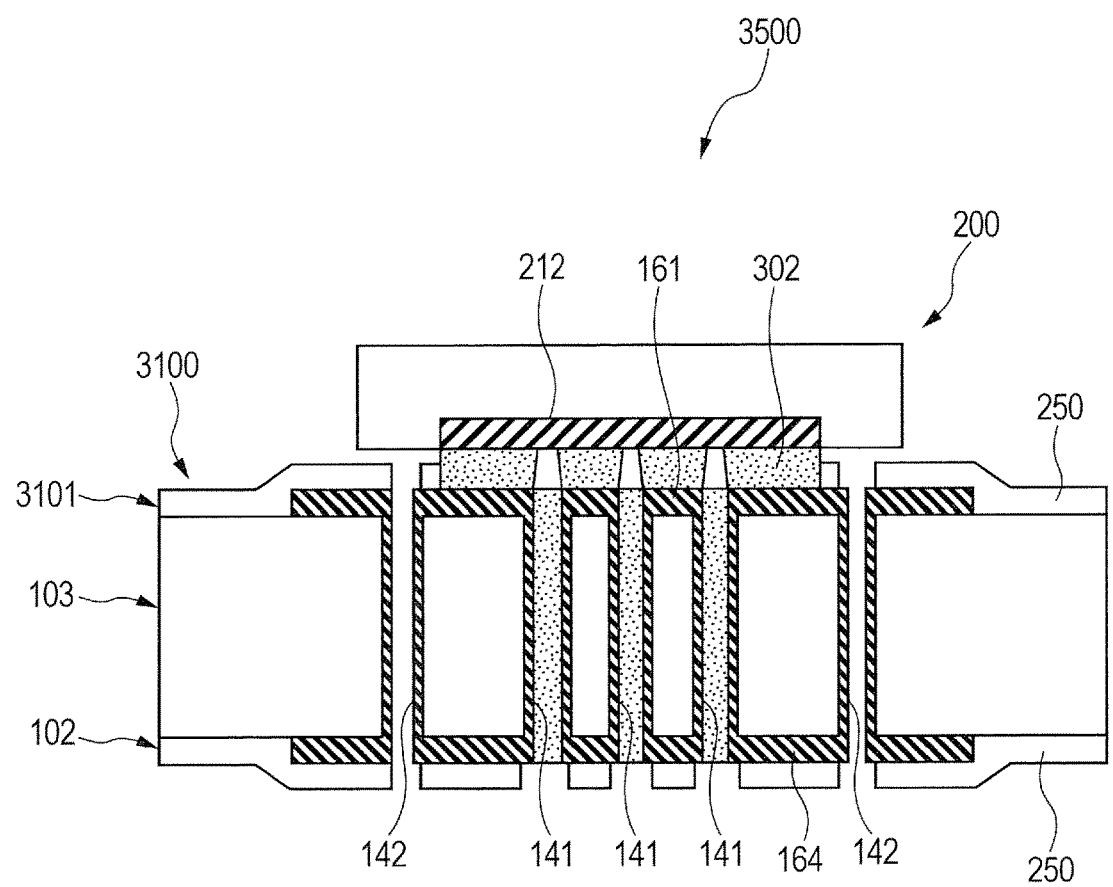
FIG. 9 is a cross sectional view illustrating a cross section of a printed-circuit board taken along the line 9-9 in FIG. 8.

A printed-circuit board (printed-wiring board) according to the third embodiment of the invention will be described. FIG. 8 is a top view illustrating the printed-wiring board according to the third embodiment of the invention. FIG. 9 is a cross sectional view illustrating a cross section of a printed-circuit board taken along the line 9-9 in FIG. 8. In the third embodiment, component elements similar to those in the first and second embodiments are designated by the same reference numerals and their description is omitted.

A printed-circuit board 3500 of the third embodiment has: a printed-wiring board 3100; and the semiconductor package 200 which has been mounted on a mounting surface (conductor layer) 3101 of the printed-wiring board 3100 and is similar to that in the first embodiment.

The printed-wiring board 3100 in the third embodiment further has a via conductor 142 in addition to the construction of the printed-wiring board 100 in the first embodiment. That is, the via conductor 142 which connects the conductor pattern 163 and the conductor pattern 164 is formed in the printed-wiring board 3100. The conductor pattern 164 is arranged in another layer 102 different from the layer 3101 in which the conductor pattern 163 has been arranged. The via conductor 142 is arranged at a position other than the position corresponding to the heat radiation plate 212 of the semiconductor package 200, that is, a position which avoids the position corresponding to the heat radiation plate 212. Therefore, when the heat radiation plate 212 and the conductor pattern 161 are joined by the solder 302, such a situation that the solder 302 flows into the via (through-hole) in which the via conductor 142 has been formed can be prevented.

Owing to the via conductor 142, since the heat conducted to the conductor pattern 163 is conducted to the conductor pattern 164 through the via conductor 142, a performance of heat radiation of the semiconductor package 200 by the printed-wiring board 3100 can be further improved.

Since the via conductor 142 is formed in the third embodiment, the via conductor 141 may be omitted.

Fourth Embodiment

A printed-circuit board (printed-wiring board) according to the fourth embodiment of the invention will be described.

Figure 10:
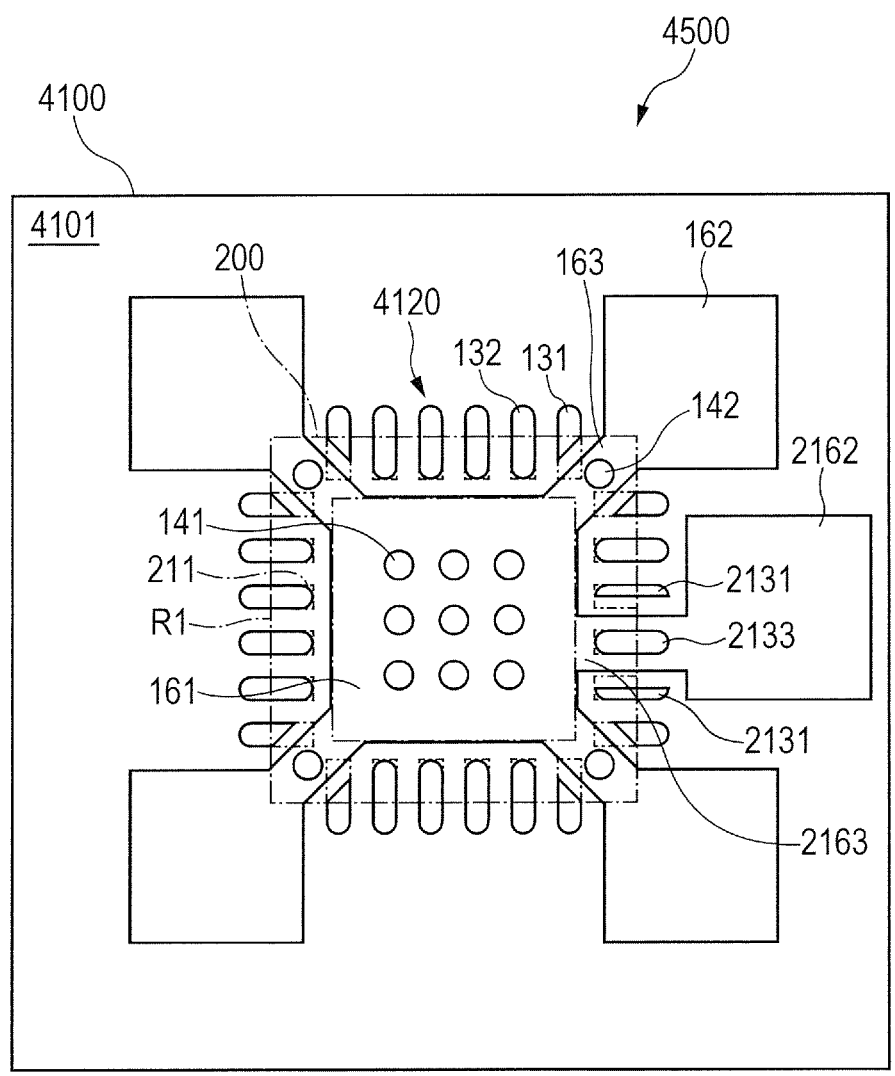
FIG. 10 is a top view illustrating a printed-wiring board according to the fourth embodiment of the invention.

FIG. 10 is a top view illustrating the printed-wiring board according to the fourth embodiment of the invention. In the fourth embodiment, component elements similar to those in the first to third embodiments are designated by the same reference numerals and their description is omitted.

A printed-circuit board 4500 according to the fourth embodiment has: a printed-wiring board 4100; and the semiconductor package 200 which has been mounted on a mounting surface (conductor layer) 4101 of the printed-wiring board 4100 and is similar to that in the first embodiment.

The printed-wiring board 4100 in the fourth embodiment is constructed by combining the printed-wiring board 2100 in the second embodiment and the printed-wiring board 3100 in the third embodiment. Specifically speaking, the printed-wiring board 4100 has: the conductor pattern 161 as a first conductor pattern; the conductor patterns 162 and 2162 as second conductor patterns; and the conductor patterns 163 and 2163 as third conductor patterns. A land group 4120 has: the lands 131 and 2131 as first lands; and the land 132 as a second land.

By constructing as mentioned above, a performance of heat radiation of the semiconductor package 200 by the printed-wiring board 4100 can be further improved.

Since the via conductor 142 is formed in the fourth embodiment, the via conductor 141 may be omitted.

Example 1

A printed-circuit board according to Example 1 of the invention will now be described. In the construction of the printed-circuit board 500 illustrated in FIG. 1 to FIGS. 3A and 3B, conditions of the printed-wiring board 100, the semiconductor package 200 as an electronic component, and the solders 301 and 302 are set as follows.

First, a construction of the printed-wiring board 100 will be described. The board 100 is a board of two layers in which a board thickness is equal to 1.6 [mm] and a board size is equal to 50 [mm]×50 [mm]. The conductor pattern 161, the conductor pattern 162, and the conductor pattern 163 are arranged on the mounting surface of the semiconductor package 200. The conductor pattern 164 of 49 [mm]×49 [mm] is arranged on the other surface on the side opposite to the mounting surface of the semiconductor package 200.

A size of the conductor pattern 161 is set to 2.7 [mm]×2.7 [mm]. A size of the conductor pattern 162 is set to 2.0 [mm]×2.0 [mm]. A width of the conductor pattern 163 is set to 0.6 [mm] and its length is set to 0.388 [mm]. Thicknesses of those conductor patterns are set to 43 [μm] and a material is Cu.

Nine vias of Φ of 0.3 [mm] are formed in the conductor pattern 161 and are connected to the conductor pattern 164 of the back surface. One via of Φ of 0.3 [mm] is arranged in the conductor pattern 162. A hole diameter of the via is set to 0.3 [mm], a thickness of a plating as a via conductor 141 which is formed in the via-hole is set to 20 [μm] and a material is Cu.

The conductor pattern 162 and the conductor pattern 163 are arranged in each of four corner portions of the semiconductor package 200. Four conductor patterns 162 are connected to the conductor pattern 161 by four conductor patterns 163, respectively. The conductor pattern 162 and the conductor pattern 163 are covered with the solder resist 250. The conductor pattern 161 is not covered with the solder resist 250 in order to join with the heat radiation plate 212 of the semiconductor package 200.

A construction of the semiconductor package 200 will be described. A package specification is set to HQFN, a size is set to 4.0 [mm]×4.0 [mm], and a thickness is set to 0.75 [mm]. A size of the heat radiation plate 212 of a center portion of the bottom surface of the semiconductor package 200 is set to 2.7 [mm]×2.7 [mm] and a thickness is set to 0.22 [mm]. A size of a semiconductor chip in the semiconductor package 200 is set to 2.3 [mm]×1.8 [mm] and a thickness is set to 0.20 [mm].

A construction of the solder 302 as a conductive jointing material to join the heat radiation plate 212 of the semiconductor package 200 with the conductor pattern 161 of the printed-wiring board 100 will be described. A size of the solder 302 is set to 2.7 [mm]×2.7 [mm], a thickness is set to 0.05 [mm], and a material is Sn—Ag.

In the foregoing construction, analyzing conditions will be described. An amount of generated heat which is supplied to the semiconductor package 200 is set to 1.0 [W]. An analyzing position of a junction temperature of the semiconductor package 200 is set to the center of the upper surface of a silicon chip existing in the semiconductor package 200. An ambient temperature of the printed-circuit board 500 is set to 25 [° C.] and an ambient environment is set to a natural convection.

An estimated junction temperature of the semiconductor package 200 of the printed-circuit board 500 in Example 1 at this time is equal to 78.9 [° C.]. A thermal resistance of the whole printed-wiring board is equal to 53.9 [° C./W] by subtracting the ambient temperature from a junction temperature of the part.

Comparative Example 1

A construction of Comparative Example 1 is similar to that of the printed-circuit board in Example 1 and differs from Example 1 with respect to a point that a width of the conductor pattern 163 is set to 0.075 [mm]. Shapes of all lands in respective partial land groups are equalized. An estimated junction temperature of the semiconductor package 200 in Comparative Example 1 at this time is equal to 82.4 [° C.]. A thermal resistance of the whole printed-wiring board is equal to 57.4 [° C./W] by subtracting the ambient temperature from the junction temperature of the semiconductor package 200.

Comparative Example 2

A construction of Comparative Example 2 is similar to that of the printed-circuit board in Example 1 and differs from Example 1 with respect to a point that the conductor pattern 163 is not arranged. Shapes of all lands in respective partial land groups are equalized. An estimated junction temperature of the semiconductor package 200 in Comparative Example 2 at this time is equal to 82.8 [° C.]. A thermal resistance of the whole printed-wiring board is equal to 57.8 [° C./W] by subtracting the ambient temperature from the junction temperature of the part.

Example 2

Example 2 of the invention will be described. In the construction of the printed-wiring board illustrated in FIG. 7, conditions of the conductor pattern 2162 and the conductor pattern 2163 are set as follows.

The conductor pattern 161 and the conductor pattern 2162 are connected by the conductor pattern 2163. A size of the conductor pattern 161 is set to 2.7 [mm]×2.7 [mm]. A size of the conductor pattern 2162 is set to 0.6 [mm]×0.6 [mm]. A width of the conductor pattern 2163 is set to 0.6 [mm] and a length is set to 1.05 [mm].

An estimated junction temperature of the semiconductor package 200 in Example 2 at this time is equal to 81.9 [° C.]. A thermal resistance of the whole printed-wiring board is equal to 56.9 [° C./W] by subtracting the ambient temperature from the junction temperature of the semiconductor package 200.

Example 3

Example 3 of the invention will be described. In the construction of the printed-wiring board illustrated in FIGS. 8 and 9, the printed-wiring board is formed by arranging one via of Φ of 0.3 [mm] into each of four conductor patterns 163 in addition to the construction of Example 1. A hole diameter of the via is set to 0.3 [mm], a thickness of a plating of the via conductor 142 formed in the via-hole is set to 20 [μm], and a material is Cu.

An estimated junction temperature of the semiconductor package 200 in Example 3 at this time is equal to 76.3 [° C.]. A thermal resistance of the whole printed-wiring board is equal to 51.3 [° C./W] by subtracting the ambient temperature from the junction temperature of the semiconductor package 200.

Example 4

Example 4 of the invention will be described. In the construction of the printed-wiring board illustrated in FIG. 10, the printed-wiring board is formed by arranging one via of Φ of 0.3 [mm] into each of four conductor patterns 163 in addition to the construction of Example 1. A hole diameter of the via is set to 0.3 [mm], a thickness of a plating of the via conductor 142 formed in the via-hole is set to 20 [μm], and a material is Cu. Further, the conductor patterns 162 are arranged in four corner portions of the semiconductor package 200, and the conductor pattern 161 and the four conductor patterns 162 are connected by the four conductor patterns 163, respectively. The conductor pattern 2162 is arranged at a position other than the four corners of semiconductor package 200. The conductor pattern 161 and the conductor pattern 2162 are connected by the conductor pattern 2163. A size of the conductor pattern 2162 is set to 0.6 [mm]×0.6 [mm], a width of the conductor pattern 2163 is set to 0.6 [mm], and a length is set to 1.05 [mm].

An estimated junction temperature of the semiconductor package 200 in Example 4 at this time is equal to 75.4 [° C.]. A thermal resistance of the whole printed-wiring board is equal to 50.4 [° C./W] by subtracting the ambient temperature from the junction temperature of the semiconductor package 200.

FIG. 11 is a graph illustrating heat radiating effects of the semiconductor packages according to the printed-wiring boards in Examples 1 to 4 and Comparative Examples 1 and 2. From results of FIG. 11, how the thermal resistance of the whole printed-wiring board changes in dependence on the widths of the conductor patterns 163 and 2163 can be compared.

The thermal resistance of the whole printed-wiring board of Example 1 is equal to 53.9 [° C./W]. The thermal resistances of the whole printed-wiring boards of Comparative Example 1, Comparative Example 2, Example 2, Example 3, and Example 4 are equal to 57.4 [° C./W], 57.8 [° C./W], 56.9 [° C./W], 51.3 [° C./W], and 50.4 [° C./W], respectively. Although the thermal resistance of the whole printed-wiring board of Comparative Example 1 is smaller than the thermal resistance in Comparative Example 2 by about 0.7 [%], the performance of heat radiation is not largely improved.

When the widths of the conductor patterns 163 and 2163 are widened on the basis of the constructions of Examples 1 to 4, the thermal resistance of the whole printed-wiring board of Example 1 is smaller than the thermal resistance of the whole printed-wiring board of Comparative Example 1 by about 6.0 [%]. That is, it is shown that according to Example 1, by widening the width of the conductor pattern 163, the performance of heat radiation of the semiconductor package 200 in the printed-wiring board 100 is largely improved. At the same time, also in Examples 2, 3, and 4, the performance of heat radiation is improved than that of Comparative Example 1.

Further, in the constructions of Examples 1 to 4, since a number of vias are not arranged on the conductor pattern 161, a large area of the conductor pattern 161 is assured. Consequently, the occurrence of a defective solder junction between the printed-wiring board and the electronic component can be also avoided.

The invention is not limited to the embodiments described above but many modifications within a technical idea of the invention are possible. The effects disclosed in the embodiments of the invention are merely the most preferable effects obtained by the invention and the effects by the invention are not limited to those disclosed in the embodiments of the invention.

Although the case where the printed-wiring board is a board comprising two layers has been described in the foregoing embodiments, the printed-wiring board is not limited to the two layers but it may be constructed by three or more layers. In the case of the printed-wiring board comprising three or more layers, an inner layer (conductor layer) is arranged between the front-face layer (conductor layer) and the front-face layer (conductor layer) through the insulator layer. It is sufficient that the fourth conductor pattern is formed on the inner layer or back-face layer.

Although the electronic component is an HQFN in the foregoing embodiment and it is particularly effective in this case, the electronic component is not limited to it but may be an HSON, HQFP, HSOP, or the like.

Although the case where the conductor pattern 163 and the conductor pattern 164 are connected by the via conductor 142 has been described in the third and fourth embodiments, the conductor pattern 163 and the conductor pattern 164 may be connected by the via conductor in the second or fourth embodiment.

Although the case where the conductor pattern 161 and the conductor pattern 164 are connected by the via conductor 141 has been described in the foregoing embodiment, the invention can be also applied to a case where the conductor pattern 161 and the via conductor 141 are omitted.

In the case where the printed-wiring board has the via conductor 142 which connects the conductor pattern 163 (or the conductor pattern 2163) and the conductor pattern 164, the invention can be also applied to a case where the via conductor 141 is omitted.

In the foregoing embodiment, if the first land adjacent to the third conductor pattern has the same electric potential as that of each of the first, second, and third conductor patterns, the first land may be connected to at least one of the first, second, and third conductor patterns.

Although the case where the land in the intermediate portion in the partial land group is the third land to which the third conductor pattern is connected has been described in the second and fourth embodiments, the land in the end portion in the partial land group may be the third land to which the third conductor pattern has been connected.

A well-known electronic component in which a terminal group is formed in a corner portion of the electronic component by a lead frame may be applied in the foregoing embodiment. In this case, the second conductor pattern or the third conductor pattern can be joined with the terminal group of the electronic component by a conductive jointing material. By radiating the heat by both of the lead frame in the electronic component and the third conductor pattern of the printed-wiring board, the performance of heat radiation of the electronic component mounting surface of the printed-wiring board is further improved. At this time, the second conductor pattern or the third conductor pattern may be constructed in such a manner that it is not covered with a partial resist while using such resist specifications that it is not come into contact with another land, a terminal of the electronic component, or the like. By constructing an electronic apparatus having the printed-circuit board of the invention and an operating unit connected to the printed-circuit board, the electronic apparatus of a smaller size suppressing an excessive accumulation of heat can be provided.

According to the invention, in order to widen the width of the third conductor pattern, the first land adjacent to the third conductor pattern is formed in the shape different from that of the second land so as to be apart from the third conductor pattern, so that the thermal resistance of the third conductor pattern is reduced. Thus, the heat conducted to the first conductor pattern is easily conducted to the second conductor pattern through the third conductor pattern. Therefore, the performance of heat radiation of the electronic component which is mounted on the printed-wiring board is improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-095338, filed May 8, 2015, which is hereby incorporated by reference herein in its entirety.

The invention claimed is:

1. A printed-circuit board comprising:
   an electronic component having a heat radiation part; and
   a printed-wiring board on which the electronic component is mounted,
   wherein the printed-wiring board includes:
      a land group with which a terminal group of the electronic component is joined;
      a first conductor pattern arranged in a mounting area where the electronic component is mounted and joined with the heat radiation part of the electronic component;
      a second conductor pattern, at least a part of which is arranged on an outside of the mounting area; and
      a third conductor pattern which connects the first conductor pattern to the second conductor pattern are formed on the printed-wiring board,
      wherein the land group includes a first land adjacent to the third conductor pattern and a second land which is not adjacent to the third conductor pattern, and
      wherein the first land is formed in a shape different from that of the second land so as to be spaced from the third conductor pattern.

2. A printed-circuit board according to claim 1, wherein the first land has one side which faces one side of the third conductor pattern so as to be spaced therefrom.

3. A printed-circuit board according to claim 2, wherein the one side of the first land and the one side of the third conductor pattern which face each other are parallel.

4. A printed-circuit board according to claim 1, wherein:
   the land group forms four partial land groups arranged along four sides of the mounting area,
   the third conductor pattern is formed so as to pass through a gap between the two adjacent partial land groups among the four partial land groups, and
   the first land is a land which is included in at least one of the two partial land groups and is located in an end portion on the side adjacent to the third conductor pattern.

5. A printed-circuit board according to claim 4, wherein an edge on the side of the first conductor pattern of the first land is further from the first conductor pattern than the edge on the side of the first conductor pattern of the second land included in the partial land group in which the first land is included.

6. A printed-circuit board according to claim 1, wherein the land group includes a third land connected to the third conductor pattern.

7. A printed-circuit board according to claim 6, wherein:
   the land group forms four partial land groups arranged along four sides of the mounting area, and
   the third land is a land located in an intermediate portion between the lands located in both end portions in at least one of the four partial land groups.

8. A printed-circuit board according to claim 1, wherein the printed-wiring board further comprises:
   a fourth conductor pattern arranged in a layer different from a layer in which the third conductor pattern is arranged, and
   a via conductor which connects the first conductor pattern and the fourth conductor pattern are formed on the printed-wiring board.

9. A printed-circuit board according to claim 1, wherein the printed-wiring board further comprises:
   a fourth conductor pattern arranged in a layer different from a layer in which the third conductor pattern is arranged, and
   a via conductor which is arranged at a position other than a position corresponding to the heat radiation part of the electronic component and which connects the third conductor pattern and the fourth conductor pattern.

10. A printed-wiring board on which an electronic component having a heat radiation part can be mounted, comprising:
   a land group with which a terminal group of the electronic component is joined;
   a first conductor pattern which is arranged in a mounting area where the electronic component is mounted and which is joined with the heat radiation part of the electronic component;
   a second conductor pattern, at least a part of which is arranged on an outside of the mounting area; and
   a third conductor pattern which connects the first conductor pattern and the second conductor pattern,
   wherein the land group includes a first land adjacent to the third conductor pattern and a second land which is not adjacent to the third conductor pattern, and
   the first land is formed in a shape different from that of the second land so as to be spaced from the third conductor pattern.

11. A printed-wiring board according to claim 10, wherein the first land has one side which faces one side of the third conductor pattern so as to be spaced therefrom.

12. A printed-wiring board according to claim 11, wherein the one side of the first land and the one side of the third conductor pattern which face each other are parallel.

13. A printed-wiring board according to claim 10, wherein:
the land group forms four partial land groups arranged along four sides of the mounting area,
the third conductor pattern is formed so as to pass through a gap between the two adjacent partial land groups among the four partial land groups, and
the first land is a land which is included in at least one of the two partial land groups and is located in an end portion on the side adjacent to the third conductor pattern.

14. A printed-wiring board according to claim 13, wherein an edge on the side of the first conductor pattern of the first land is further from the first conductor pattern than the edge on the side of the first conductor pattern of the second land included in the partial land group in which the first land is included.

15. A printed-wiring board according to claim 10, wherein the land group includes a third land connected to the third conductor pattern.

16. A printed-wiring board according to claim 15, wherein:
the land group forms four partial land groups arranged along four sides of the mounting area, and
the third land is a land located in an intermediate portion between the lands located in both end portions in at least one of the four partial land groups.

17. A printed-wiring board according to claim 10, further comprising:
a fourth conductor pattern arranged in a layer different from a layer in which the third conductor pattern is arranged; and
a via conductor which connects the first conductor pattern and the fourth conductor pattern.

18. A printed-wiring board according to claim 10, further comprising:
a fourth conductor pattern arranged in a layer different from a layer in which the third conductor pattern is arranged; and
a via conductor which is arranged at a position other than a position corresponding to the heat radiation part of the electronic component and which connects the third conductor pattern and the fourth conductor pattern.

19. A printed-wiring board according to claim 18, further comprising a via conductor which connects the first conductor pattern and the fourth conductor pattern.

20. An electronic device comprising:
a printed-circuit board; and
an operating unit connected to the printed-circuit board, wherein the printed-circuit board comprises:
an electronic component having a heat radiation part; and
a printed-wiring board on which the electronic component is mounted,
wherein the printed-wiring board comprises:
a land group with which a terminal group of the electronic component is joined;
a first conductor pattern arranged in a mounting area where the electronic component is mounted and joined with the heat radiation part of the electronic component;
a second conductor pattern, at least a part of which is arranged on an outside of the mounting area; and
a third conductor pattern which connects the first conductor pattern to the second conductor pattern,
wherein the land group includes a first land adjacent to the third conductor pattern and a second land which is not adjacent to the third conductor pattern, and
the first land is formed in a shape different from that of the second land so as to be spaced from the third conductor pattern.

* * * * *